(12) United States Patent
Yanagita et al.

(10) Patent No.: US 6,391,067 B2
(45) Date of Patent: *May 21, 2002

(54) WAFER PROCESSING APPARATUS AND METHOD, WAFER CONVEY ROBOT, SEMICONDUCTOR SUBSTRATE FABRICATION METHOD, AND SEMICONDUCTOR FABRICATION APPARATUS

(75) Inventors: Kazutaka Yanagita; Kiyofumi Sakaguchi, both of Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/015,582

(22) Filed: Jan. 29, 1998

(30) Foreign Application Priority Data

Feb. 4, 1997 (JP) .............................................. 9-021796
Feb. 14, 1997 (JP) .............................................. 9-030887

(51) Int. Cl.[7] .......................... H01L 21/00; H01L 21/64
(52) U.S. Cl. .................................................... 29/25.01
(58) Field of Search .......................................... 29/25.01

(56) References Cited

U.S. PATENT DOCUMENTS

| | | | |
|---|---|---|---|
| 3,473,670 A | * | 10/1969 | Elftmann |
| 3,782,522 A | * | 1/1974 | Wyers |
| 3,893,869 A | | 7/1975 | Mayer et al. |
| 3,964,957 A | | 6/1976 | Walsh |
| 4,191,295 A | | 3/1980 | Tams, III |
| 4,927,781 A | | 5/1990 | Miller |
| 4,952,115 A | | 8/1990 | Ohkase |
| 5,191,908 A | | 3/1993 | Hiroe et al. ................... 134/76 |
| 5,275,184 A | | 1/1994 | Nishizawa et al. ....... 134/57 R |
| 5,327,921 A | | 7/1994 | Mokuo et al. |
| 5,340,437 A | | 8/1994 | Erk et al. |
| 5,503,173 A | | 4/1996 | Kudo et al. |
| 5,520,205 A | | 5/1996 | Guldi et al. |
| 5,593,905 A | | 1/1997 | Johnson et al. |
| 5,672,212 A | | 9/1997 | Manos |
| 6,127,281 A | | 10/2000 | Sakaguchi et al. |
| 6,199,563 B1 | | 3/2001 | Uehara et al. |

FOREIGN PATENT DOCUMENTS

| | | |
|---|---|---|
| CA | 2206139 | 12/1997 |
| CA | 2228571 | 12/1997 |
| CA | 2229975 | 8/1998 |
| EP | 0 319 806 | 6/1989 |
| EP | 0 481 723 A1 | 4/1992 |
| EP | 0 658 923 A1 | 6/1995 |
| EP | 0 860 860 A2 | 8/1998 |
| EP | 0 938 132 A2 | 8/1999 |
| FR | 2626261 | 7/1989 |
| JP | 61-086929 | 6/1986 |
| JP | 61-228629 | 10/1986 |
| JP | 61-247034 | 11/1986 |
| JP | 62-274730 | 11/1987 |
| JP | 62-281430 | * 12/1987 |

(List continued on next page.)

OTHER PUBLICATIONS

Sakaguchi et al., "Extremely High Selective Etching of Porous Si for Single Etch–Stop Bond–and–Etch–Back Silicon–on–Insulator," JP J. Appl. Phys. Vol. 34, (1995) pp. 842–847.

Austrian Search Report ( No Date Available).

*Primary Examiner*—Olik Chaudhuri
(74) *Attorney, Agent, or Firm*—Morgan & Finnegan, LLP

(57) ABSTRACT

A holder driving mechanism holds a wafer holder with gripping portions, and swings it within a wafer processing bath. When the peripheral portion of a wafer comes into contact with the distal end portion of a swing support member, the wafer rotates and vertically moves in the wafer holder.

17 Claims, 12 Drawing Sheets

FOREIGN PATENT DOCUMENTS

| | | |
|---|---|---|
| JP | 1-304733 | 12/1989 |
| JP | 3-77347 | 4/1991 |
| JP | 3-231428 | 10/1991 |
| JP | 3-257826 | 11/1991 |
| JP | 5-055180 | 3/1993 |
| JP | 05-152277 | 6/1993 |
| JP | 5-152277 | 6/1993 |
| JP | 5-217990 | 8/1993 |
| JP | 5-335401 | 12/1993 |
| JP | 5-343377 | 12/1993 |
| JP | 06-011849 | 1/1994 |
| JP | 6-021030 | 1/1994 |
| JP | 6-168928 | 6/1994 |
| JP | 07022495 A | 1/1995 |
| JP | 7-106292 | 4/1995 |
| JP | 8-078387 | 3/1996 |
| JP | 8-316182 | 11/1996 |
| JP | 9-010709 | 1/1997 |
| JP | 10-150013 | 6/1998 |
| KR | 90-971 | 1/1990 |
| KR | 95-10188 | 4/1995 |
| WO | 92/20985 | 11/1992 |
| WO | WO 87/06862 | 8/1998 |

* cited by examiner

WAFER PROCESSING APPARATUS AND METHOD, WAFER CONVEY ROBOT, SEMICONDUCTOR SUBSTRATE FABRICATION METHOD, AND SEMICONDUCTOR FABRICATION APPARATUS

BACKGROUND OF THE INVENTION

1. Field of the Invention

The present invention relates to a wafer processing apparatus and method, a wafer convey robot, a semiconductor substrate fabrication method, and a semiconductor fabrication apparatus and, more particularly, to a wafer processing apparatus and method which process a wafer by dipping the wafer into a processing solution, a wafer convey robot suitable for this processing, and a semiconductor substrate fabrication method and semiconductor fabrication apparatus to which the processing is applied.

2. Description of the Related Art

Wet etching is a typical example of processing performed by dipping a wafer into a solution. One subject of wet etching is to improve the in-plane uniformity. Conventionally, the in-plane uniformity is ensured by supplying fresh etching solution to the reaction surface by circulating the etching solution in a bath.

Another example of the processing performed by dipping a wafer into a solution is wafer cleaning processing. Japanese Patent Laid-Open No. 8-293478 has disclosed a wafer cleaning apparatus which increases the wafer cleaning efficiency by applying ultrasonic waves while dipping part of a wafer into a solution and rotating the wafer.

The wafer cleaning apparatus disclosed in Japanese Patent Laid-Open No. 8-93478 rotates a wafer upon bringing the wafer into contact with a rotating cam, which makes the cam and its accessories generate particles.

In this wafer cleaning apparatus, the strength of standing waves of ultrasonic waves changes at the center and peripheral portion of the wafer. Since the cam obstructs the transmission of ultrasonic waves, the ultrasonic waves cannot be uniformly supplied to the entire surface of the wafer. Accordingly, the wafer cannot be uniformly processed.

In the wafer cleaning apparatus, ultrasonic waves vibrate the cam and the solution in the bath, and as a result, the wafer also vibrates. The wafer and the cam tend to slip with respect to each other, and the wafer cannot rotate uniformly.

In the wafer cleaning apparatus, when a wafer having an orientation flat is to be processed, the conditions for transmitting the rotating force from the cam to the wafer change at the orientation flat and the remaining portion. For this reason, the wafer -cannot rotate uniformly.

SUMMARY OF THE INVENTION

The present invention has been made in consideration of the above problems and has as its object to make wafer processing uniform.

It is another object of the present invention to prevent contamination of a wafer caused by particles.

A wafer processing apparatus according to the present invention is a wafer processing apparatus for processing a wafer by dipping the wafer into a processing solution, characterized by comprising a wafer processing bath, a holding portion for directly or indirectly holding the wafer, and a driving portion for supporting the holding portion from above the processing bath to swing the holding portion within the processing bath.

In the wafer processing apparatus, the driving portion preferably also serves as a convey mechanism for conveying the wafer between the apparatus and another apparatus.

The wafer processing apparatus preferably further comprises ultrasonic generating means for generating ultrasonic waves in the processing bath.

The wafer processing apparatus preferably further comprises a swing support member that comes into contact with a peripheral portion of the wafer in swinging the wafer by the driving portion, thereby supporting swinging by the driving portion.

In the wafer processing apparatus, a portion of the swing support member which may come into contact with the peripheral portion of the wafer is preferably rounded.

In the wafer processing apparatus, a portion of the swing support member which may come into contact with the peripheral portion of the wafer preferably has a groove in a direction substantially parallel to a wafer surface.

In the wafer processing apparatus, the groove preferably has a V shape.

In the wafer processing apparatus, the groove preferably has a full-wave rectifying shape.

In the wafer processing apparatus, the processing bath preferably comprises a circulating mechanism including an overflow bath.

In the wafer processing apparatus, the driving portion preferably swings the holding portion to rotate the wafer when the peripheral portion of the wafer comes into contact with the swing support member.

In the wafer processing apparatus, the ultrasonic generating means preferably comprises an ultrasonic bath, an ultrasonic source, and an adjusting mechanism for adjusting a position of the ultrasonic source in the ultrasonic bath, and ultrasonic waves are preferably transmitted to the processing bath via an ultrasonic transmitting medium placed in the ultrasonic bath.

In the wafer processing apparatus, the driving portion preferably comprises a first driving portion for horizontally driving the holding portion, and a second driving portion for vertically driving the holding portion.

In the wafer processing apparatus, the holding portion preferably holds the wafer substantially perpendicular to a bottom surface of the processing bath, and the driving portion preferably swings the wafer within a plane substantially perpendicular to the bottom surface of the processing bath.

In the wafer processing apparatus, the driving portion preferably swings the holding portion within the processing bath to substantially uniformly process the wafer with a processing solution.

In the wafer processing apparatus, the holding portion can preferably hold a wafer holder capable of storing a plurality of wafers.

In the wafer processing apparatus, at least portions of the processing bath, the holding portion, and the driving portion, which may come into contact with a processing solution, are preferably made of a material selected from the group consisting of quartz and plastic.

In the wafer processing apparatus, at least portions of the processing bath, the holding portion, and the driving portion, which may come into contact with a processing solution, are preferably made of a material selected from the group consisting of a fluorine resin, vinyl chloride, polyethylene, polypropylene, polybutyleneterephthalate (PBT), and polyetheretherketone (PEEK).

A wafer convey apparatus according to the present invention is a wafer convey apparatus for conveying a wafer, characterized by comprising a holding portion for directly or indirectly holding the wafer, and a driving portion for driving the holding portion along a convey path, the driving portion dipping the wafer into a wafer processing bath and swinging the wafer midway along the convey path.

In the wafer convey apparatus, the driving portion preferably comprises a first driving portion for horizontally driving the holding portion, and a second driving portion for vertically driving the holding portion.

In the wafer convey apparatus, the holding portion preferably holds the wafer substantially perpendicular to a bottom surface of the processing bath, and the driving portion preferably swings the wafer within a plane substantially perpendicular to the bottom surface of the processing bath.

In the wafer convey apparatus, the driving portion preferably swings the holding portion within the processing bath to substantially uniformly process the wafer with a processing solution in the processing bath.

In the wafer convey apparatus, the driving portion preferably swings the holding portion within the processing bath to enhance swinging of the wafer when a peripheral portion of the wafer comes into contact with a projection formed in the processing bath.

In the wafer convey apparatus, the driving portion preferably swings the holding portion within the processing bath to rotate the wafer when a peripheral portion of the wafer comes into contact with a projection formed in the processing bath.

In the wafer convey apparatus, the holding portion can preferably hold a wafer holder capable of storing a plurality of wafers.

A semiconductor fabrication apparatus according to the present invention is characterized by comprising the wafer convey apparatus, and one or a plurality of wafer processing apparatuses.

A wafer processing method according to the present invention is a wafer processing method of processing a wafer by dipping the wafer into a processing solution, characterized by comprising dipping a wafer into the processing solution while supporting the wafer from above a wafer processing bath, and swinging the wafer within the processing bath. In the wafer processing method, while the wafer is swung within the processing bath, ultrasonic waves are preferably generated in the processing solution.

In the wafer processing method, when the wafer is swung within the processing bath, a peripheral portion of the wafer is preferably brought into contact with a projection formed in the processing bath to enhance swinging of the wafer.

In the wafer processing method, when the wafer is swung within the processing bath, a peripheral portion of the wafer is preferably brought into contact with a projection formed in the processing bath to rotate the wafer.

In the wafer processing method, the wafer is preferably swung to substantially uniformly process the wafer with the processing solution.

The wafer processing method is suitable for etching the wafer by using an etching solution as the processing solution.

The wafer processing method is suitable for etching a wafer having a porous silicon layer by using an etching solution as the processing solution.

An SOI wafer fabrication method according to the present invention is characterized by comprising fabricating an SOI wafer by using the wafer processing method in a part of fabrication steps.

A wafer processing method according to the present invention is characterized by comprising processing a wafer by using the wafer processing apparatus.

A wafer processing method according to the present invention is characterized by comprising etching a specific layer formed on a wafer by using the wafer processing apparatus.

An SOI wafer fabrication method according to the present invention is characterized by comprising fabricating an SOI wafer by using the wafer processing method in a part of fabrication steps.

A wafer processing method according to the present invention is a wafer processing method of processing a wafer while supplying ultrasonic waves, characterized by comprising completely dipping the wafer into a processing solution, and processing the wafer while changing a strength of ultrasonic waves which act on the wafer.

A wafer processing method according to the present invention is a wafer processing method of processing a wafer while supplying ultrasonic waves, characterized by comprising completely dipping the wafer into a processing solution, and processing the wafer while moving the wafer.

A wafer processing method according to the present invention is a wafer processing method of processing a wafer while supplying ultrasonic waves, characterized by comprising completely dipping the wafer in a processing solution, and processing the wafer while swinging the wafer.

A wafer processing method according to the present invention is a wafer processing method of processing a wafer while supplying ultrasonic waves, characterized by comprising completely dipping the wafer in a processing solution, and processing the wafer while swinging the wafer to cross a plane of vibration of ultrasonic waves.

A wafer processing method according to the present invention is a wafer processing method of processing a wafer while supplying ultrasonic waves, characterized by comprising completely dipping the wafer in a processing solution, supporting the wafer substantially perpendicular to a plane of vibration of ultrasonic waves, and processing the wafer while swinging the wafer to cross the plane of vibration of ultrasonic waves.

A wafer processing method according to the present invention is a wafer processing method of processing a wafer while supplying ultrasonic waves, characterized by comprising completely dipping the wafer in a processing solution, supporting the wafer substantially parallel to a plane of vibration of ultrasonic waves, and processing the wafer while swinging the wafer to cross the plane of vibration of ultrasonic waves.

A semiconductor substrate fabrication method according to the present invention is characterized by comprising the step of forming an unporous layer on a porous layer formed on a surface of a first substrate, the step of adhering a first substrate side of a prospective structure and a second substrate prepared separately to sandwich the unporous layer between the first substrate side and the second substrate, the removal step of removing the first substrate from the adhered structure to expose the porous layer on a second substrate side thereof, and the etching step of etching the porous layer while the second substrate side on which the porous layer is exposed is completely dipped into an etching solution, and ultrasonic waves are supplied, thereby exposing a surface of the second substrate side, the etching step changing a strength of ultrasonic waves which act on the second substrate side.

A semiconductor substrate fabrication method according to the present invention is characterized by comprising the step of forming an unporous layer on a porous layer formed on a surface of a first substrate, the step of adhering a first substrate side of a prospective structure and a second substrate prepared separately to sandwich the unporous layer between the first substrate side of a prospective structure and the second substrate, the removal step of removing the first substrate from the adhered structure to expose the porous layer on a second substrate side thereof, and the etching step of etching the porous layer while the second substrate side on which the porous layer is exposed is completely dipped into an etching solution, and ultrasonic waves are supplied, thereby exposing a surface of the second substrate side, the etching step moving the second substrate side.

A semiconductor substrate fabrication method according to the present invention is characterized by comprising the step of forming an unporous layer on a porous layer formed on a surface of a first substrate, the step of adhering a first substrate side of a prospective structure and a second substrate prepared separately to sandwich the unporous layer between the first substrate side and the second substrate, the removal step of removing the first substrate from the adhered structure to expose the porous layer on a second substrate side thereof, and the etching step of etching the porous layer while the second substrate side on. which the porous layer is exposed is completely dipped into an etching solution, and ultrasonic waves are supplied, thereby exposing a surface of the second substrate side, the etching step swinging the second substrate side.

A semiconductor substrate fabrication method according to the present invention is characterized by comprising the step of forming an unporous layer on a porous layer formed on a surface of a first substrate, the step of adhering a first substrate side of a prospective structure and a second substrate prepared separately to sandwich the unporous layer between the first substrate side and the second substrate, the removal step of removing the first substrate from the adhered structure to expose the porous layer on a second substrate side thereof, and the etching step of etching the porous layer while the second substrate side on which the porous layer is exposed is completely dipped into an etching solution, and ultrasonic waves are supplied, thereby exposing a surface of the second substrate side, the etching step swinging the second substrate side to cross a plane of vibration of ultrasonic waves.

A semiconductor substrate fabrication method according to the present invention is characterized by comprising the step of forming an unporous layer on a porous layer formed on a surface of a first substrate, the step of adhering a first substrate side of a prospective structure and a second substrate prepared separately to sandwich the unporous layer between the first substrate side and the second substrate, the removal step of removing the first substrate from the adhered structure to expose the porous layer on a second substrate side thereof, and the etching step of etching the porous layer while the second substrate side on which the porous layer is exposed is completely dipped into an etching solution and supported substantially perpendicular to a plane of vibration of ultrasonic waves, and ultrasonic waves are supplied, thereby exposing a surface of the second substrate side, the etching step swinging the second substrate side to cross the plane of vibration of ultrasonic waves.

A semiconductor substrate fabrication method according to the present invention is characterized by comprising the step of forming an unporous layer on a porous layer formed on a surface of a first substrate, the step of adhering a first substrate side of a prospective structure and a second substrate prepared separately to sandwich the unporous layer between the first substrate side and the second substrate, the removal step of removing the first substrate from the adhered structure to expose the porous layer on a second substrate side thereof, and the etching step of etching the porous layer while the second substrate side on which the porous layer is exposed is completely dipped into an etching solution and supported substantially parallel to a plane of vibration of ultrasonic waves, and ultrasonic waves are supplied, thereby exposing a surface of the second substrate side, the etching step swinging the second substrate side to cross the plane of vibration of ultrasonic waves.

Further objects, features and advantages of the present invention will become apparent from the following detailed description of embodiments of the present invention with reference to the accompanying drawings.

DETAILED DESCRIPTION OF THE PREFERRED EMBODIMENT

A preferred embodiment of the present invention will be described below with reference to the accompanying drawings.

First Embodiment

Figure 1A:
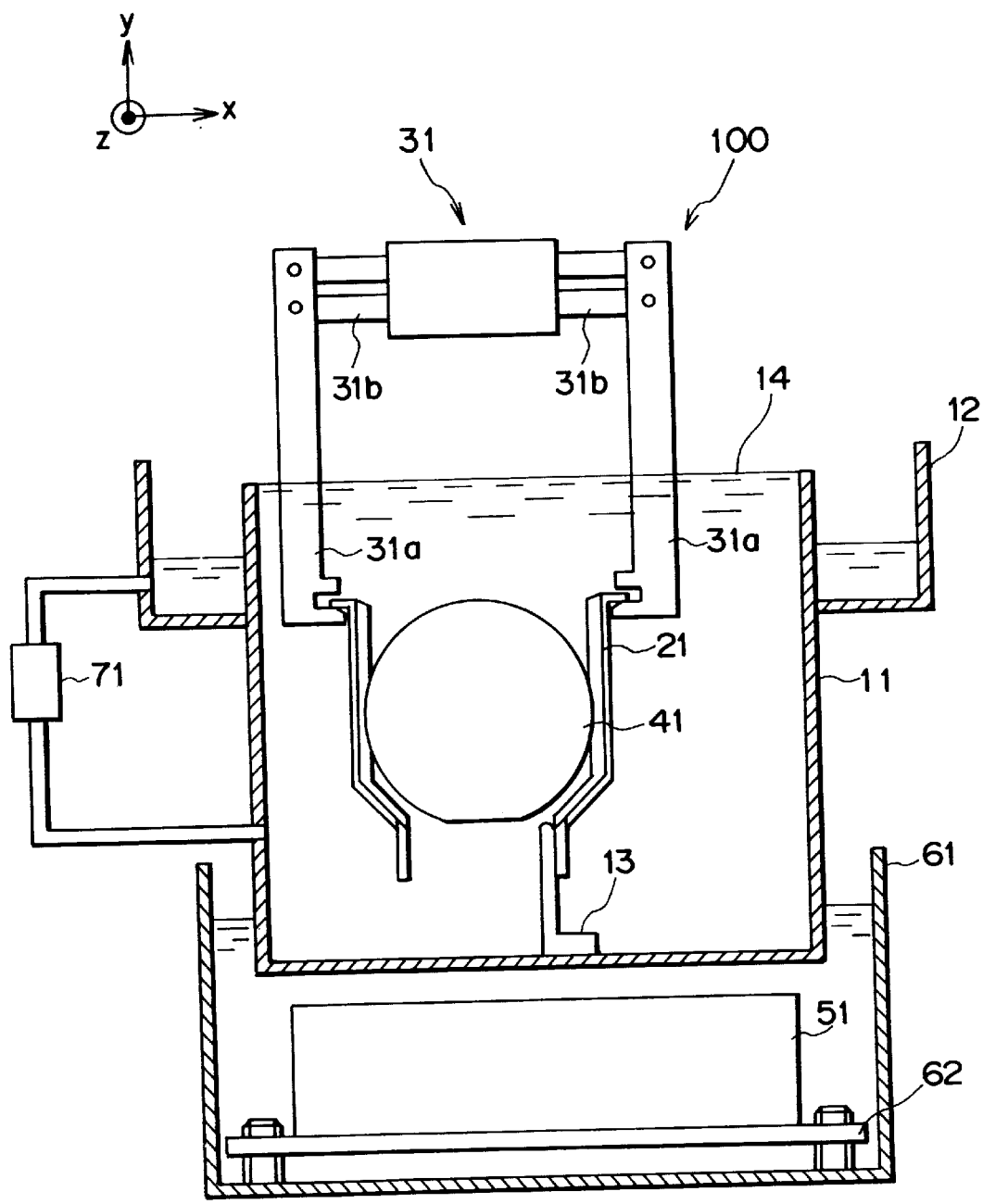
FIG. 1A is a view showing an outline of the construction of a wafer processing apparatus according to a preferred embodiment of the present invention.

FIG. 1A is a view showing an outline of the construction of a wafer processing apparatus according to the preferred embodiment of the present invention. The wafer processing apparatus according to this embodiment can be widely applied to etching, cleaning, and another processing which supplies a processing solution to a wafer.

In a wafer processing apparatus 100 according to this embodiment, portions which may come into contact with a processing solution are preferably made from quartz or plastic in accordance with the intended use. Preferable examples of the plastic are a fluorine resin, vinyl chloride, polyethylene, polypropylene, polybutyleneterephthalate (PBT), and polyetheretherketone (PEEK). Preferable examples of the fluorine resin are PVDF, PFA, and PTFE.

This wafer processing apparatus 100 has a wafer processing bath 11, and a holder driving mechanism 31 for swinging a wafer holder 21 in the wafer processing bath 11. The wafer processing apparatus 100 preferably comprises an ultrasonic bath 61.

To process wafers, the wafer processing bath 11 is filled with a processing solution. A 4-plane overflow bath 12 is mounted on the wafer processing bath 11, and supplies a processing solution from the bottom portion of the wafer processing bath 11 into the wafer processing bath 11 by a circulator 71 incorporating a filter. The processing solution overflowing from the wafer processing bath 11 is stored in the 4-plane overflow bath 12, and discharged from the bottom portion of the 4-plane overflow bath 12 toward the circulator 71. Since the wafer processing apparatus 100 agitates the processing solution while swinging the wafer holder 21 by the holder driving mechanism 31, the liquid level of the processing solution can be kept constant. Therefore, the circulating system including the 4-plane overflow bath 12 is very useful.

The wafer holder 21 may be a commercially available product, and is preferably made from quartz or plastic. Preferable examples of the plastic are a fluorine resin, vinyl chloride, polyethylene, polypropylene, polybutyleneterephthalate (PBT), and polyetheretherketone (PEEK). Preferable examples of the fluorine resin are PVDF, PFA, and PTFE.

The holder driving mechanism 31 has a pair of gripping portions 31a for gripping the wafer holder 21. The wafer holder 21 is gripped by the pair of gripping portions 31a and dipped in the wafer processing bath 11. While the wafer holder 21 is swung within the wafer processing bath 11, desired processing can be performed for a wafer 41. The holder driving mechanism 31 functions to convey the wafer holder 21 holding the wafer 41 having undergone previous processing to the wafer processing bath 11 or the next processing, whereas it functions as part of the wafer processing apparatus 100.

In this embodiment, the wafer 41 is indirectly held by holding the wafer holder 21 with the gripping portions 31a. Alternatively, the wafer 41 can be directly held by, e.g., a chucking pad in place of the gripping portions 31a. The direction to hold the wafer 41 is not limited to a direction perpendicular to the bottom surface of the wafer processing bath 11, and may be a direction parallel to the bottom surface.

A swing support member 13 for increasing the swing efficiency of the wafer 41 in swinging the wafer 41 by the holder driving mechanism 31 is preferably arranged at the bottom portion of the wafer processing bath 11. When the wafer holder 21 moves, the swing support member 13 contacts the peripheral portion of the wafer 41 held by the wafer holder 21 to rotate the wafer 41 by the frictional force and vertically move it within the wafer holder 21. The swing support member 13 is useful for improving the in-plane uniformity of the processed wafer.

It is also effective to arrange a driving mechanism for moving the swing support member 13 vertically (y-axis direction) and/or horizontally (x-axis direction). In this case, the swing support member 13 itself can move to rotate the wafer 41 and vertically move it within the wafer holder 21. Accordingly, the moving range of the wafer holder 21 by the holder driving mechanism 31 can be reduced, and in other words, the wafer processing bath 11 can be downsized.

An ultrasonic source 51 is arranged in the ultrasonic bath 61, and filled with an ultrasonic transmitting medium (e.g., water). The ultrasonic source 51 is fixed to an adjusting mechanism 62 for vertically and/or horizontally adjusting the position of the ultrasonic source 51. Ultrasonic waves to be supplied to the wafer processing bath 11, more specifically, to the wafer 41 can be optimized by adjusting the positional relationship between the ultrasonic source 51 and the wafer processing bath 11 by the adjusting mechanism 62. The ultrasonic source 51 preferably has a function of adjusting the frequency or strength of ultrasonic waves to be generated. This can further optimize the supply of ultrasonic waves. Since the ultrasonic source 51 has the function for optimizing the supply of ultrasonic waves to the wafer 41, various types of wafers can be processed.

Figure 1B:
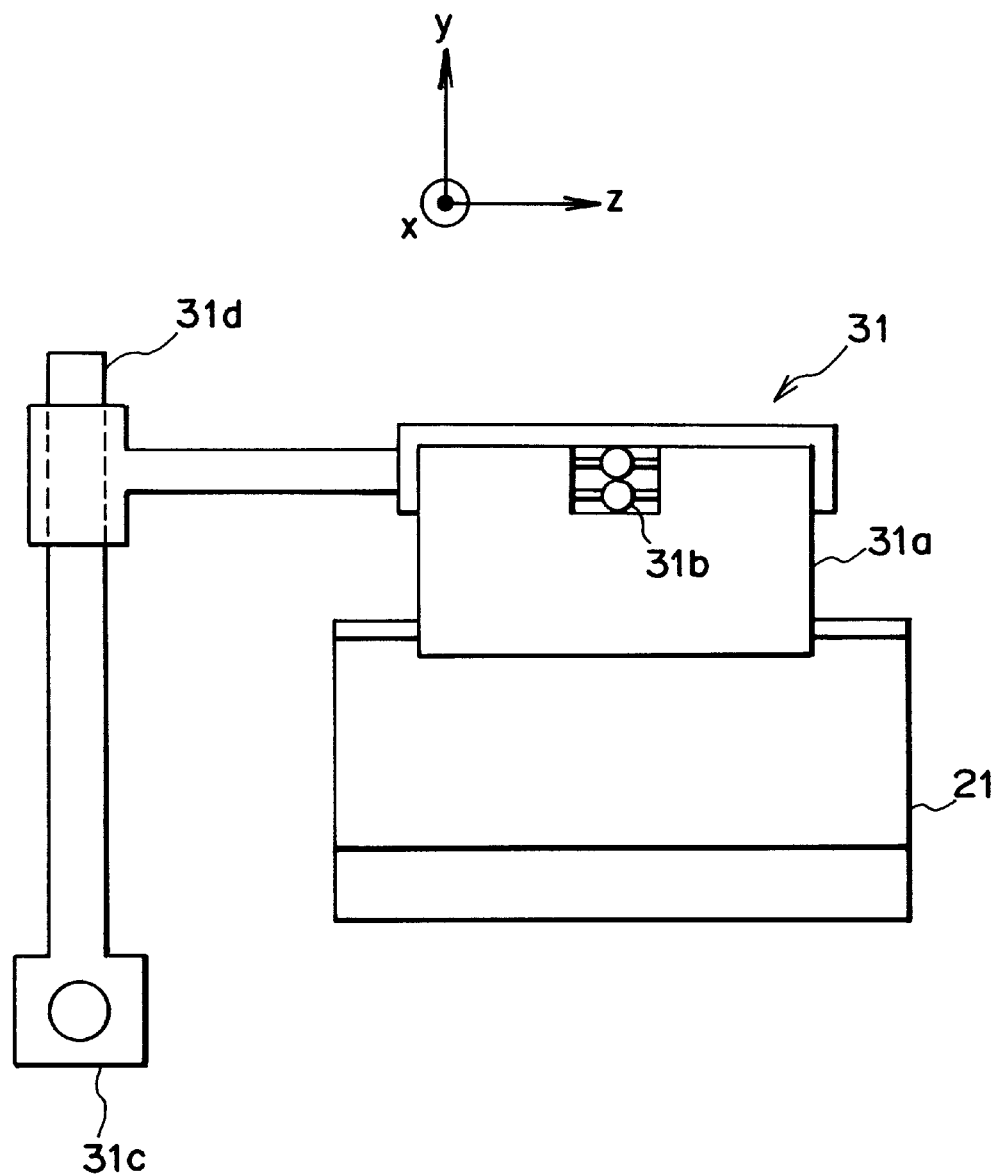
FIG. 1B is a view showing an outline of the construction of a holder driving mechanism.

FIG. 1B is a view showing an outline of the construction of the holder driving mechanism 31. The gripping portions 31a are opened by extending opening/closing rods 31b, and closed by contracting these rods 31b. The holder driving mechanism 31 moves in the x-axis direction along a horizontal driving shaft 31c and in the y-axis direction along a vertical driving shaft 31d.

Figure 2A:
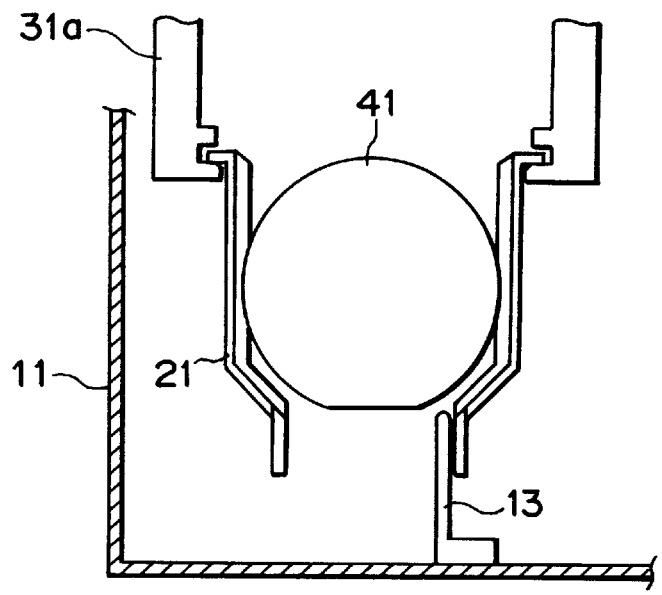
FIGS. 2A to 2E are views for explaining a wafer swinging method.
Figure 2B:
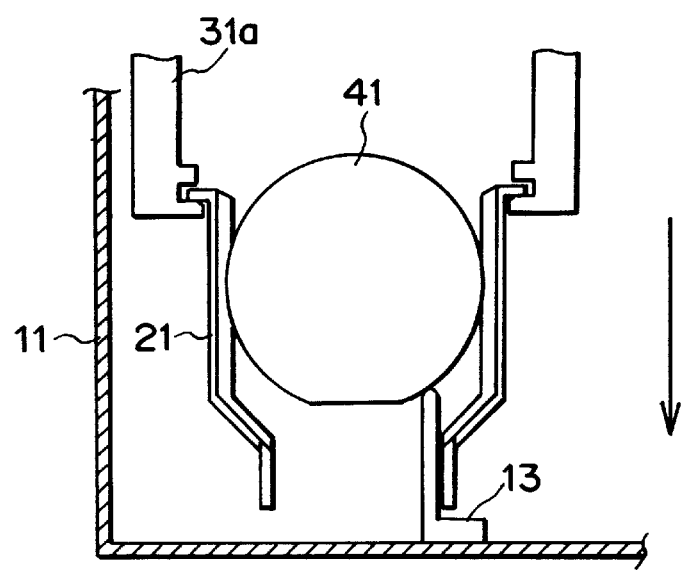

FIGS. 2A to 2E are views for explaining a wafer swinging method. In FIGS. 2A to 2E, the arrows indicate the moving direction of the wafer holder 21. FIG. 2A shows a state immediately before starting swinging a wafer. When the start of wafer swinging is instructed, the holder driving mechanism 31 depresses the gripping portions 31a downward under computer control, as shown in FIG. 2B. During this depression, the peripheral portion of the wafer 41 comes into contact with the swing support member 13. As a result, the lower portion of the wafer 41 is supported by the swing support member 13.

Figure 3:
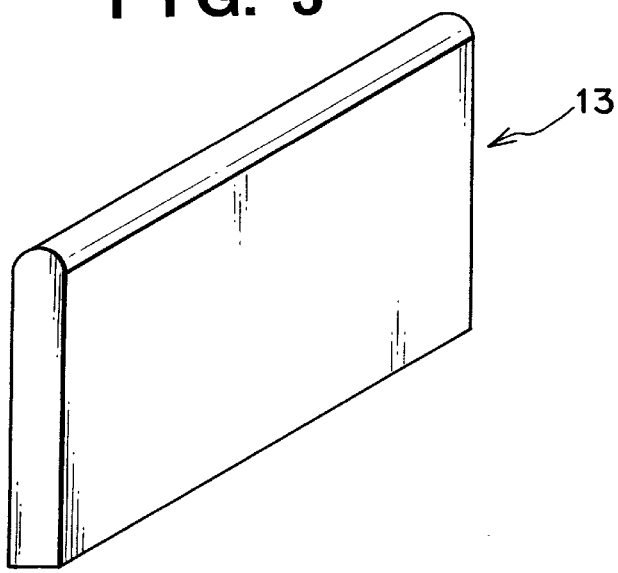
FIG. 3 is a view showing an example of the construction of a swing support member.

The swing support member 13 may generate a few particles upon contact with the wafer 41. The swing support member 13 preferably smoothly contacts the wafer 41 by rounding the distal end portion of the swing support member 13, as shown in FIG. 3.

Since the swing support member 13 suffices to support the swing of the wafer 41, it can be formed into a shape, e.g., a thin plate not to obstruct the transmission of ultrasonic waves. With this shape, the ultrasonic waves to be supplied to the wafer 41 can be uniformed to uniformly process the wafer 41.

Slight ultrasonic nonuniformity caused by the swing support member 13 does not pose any problem because the wafer processing apparatus 100 processes the wafer 41 while changing the relative positional relationship between the wafer 41 and the swing support member 13, in other words, the relative positional relationship between the wafer 41 and the wafer processing bath 11.

Since a slightly larger depression amount of the wafer holder 21 can increase the contact pressure between the wafer 41 and the swing support member 13, a slip between the swing support member 13 and the wafer 41 can be prevented to prevent operation failure. This is because, if the depression amount is too small, the gravity for the wafer 41 acts on the wafer holder 21 more greatly than on the distal end portion of the swing support member 13. When the swing support member 13. having the shape according to this embodiment is used, the depression amount is preferably about 30 mm after the wafer 41 comes into contact with the swing support member 13.

Figure 2C:
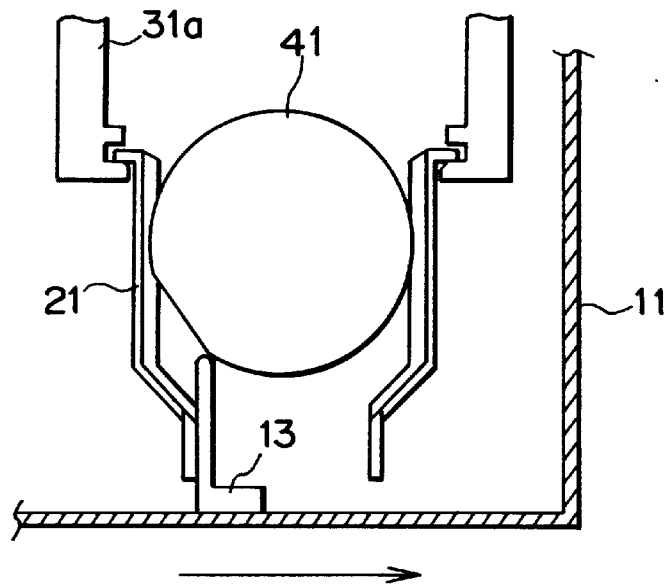

Upon depressing the wafer holder 21, the holder driving mechanism 31 moves the gripping portions 31a rightward (positive direction of the X axis) under computer control, as shown in FIG. 2C. As a result, the wafer 41 substantially horizontally moves rightward (positive direction of the X axis) in the wafer processing bath 11 while rotating clockwise. The moving amount of the gripping portions 31a must be set to fall within the range in which these gripping portions 31a do not collide against an opening portion at the lower portion of the wafer holder 21.

Figure 2D:
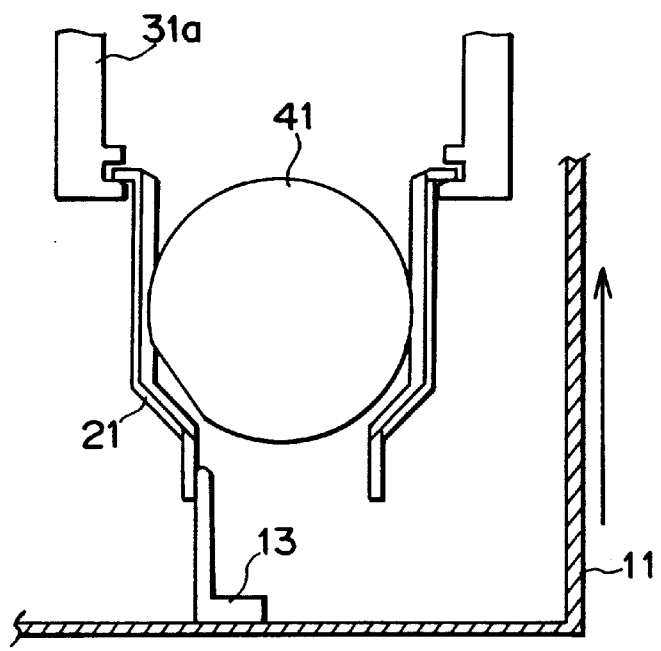

After the wafer holder 21 has moved rightward (positive direction of the X axis), the holder driving mechanism 31 vertically moves the gripping portions 31a under computer control, as shown in FIG. 2D. The moving amount of the gripping portions 31a preferably falls within the range in which the wafer 41 does not come close to a liquid surface 14 of the processing solution. This is because particles may attach to the surface of the wafer 41 if the wafer 41 comes close to the liquid surface 14.

Figure 2E:
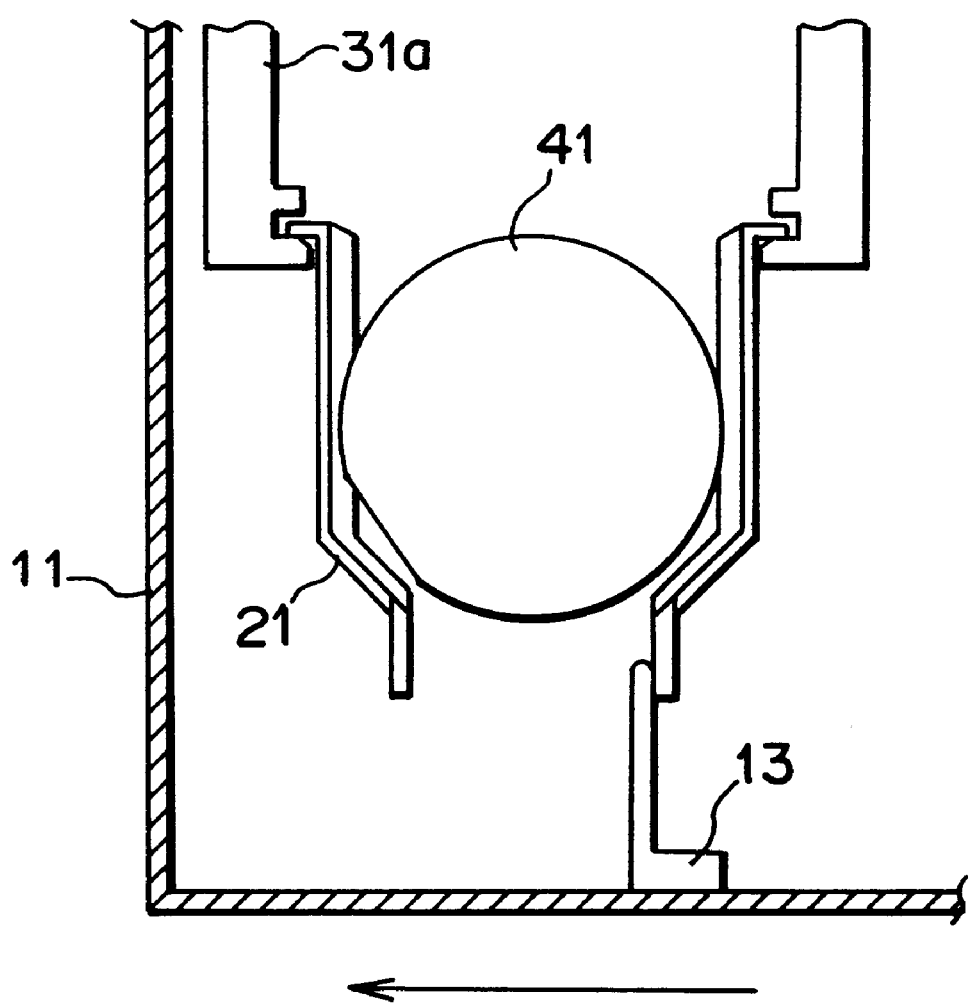

Upon completion of the upward movement of the wafer holder 21, the holder driving mechanism 31 moves the gripping portions 31a leftward (negative direction of the X axis) under computer control to return them in the initial state (FIG. 2A), as shown in FIG. 2E.

By repeatedly performing the above operation (FIG. 2A→FIG. 2B→FIG. 2C→FIG. 2D→) FIG. 2E), the wafer 41 can be properly swung and uniformly processed.

According to the wafer processing apparatus 100, since the wafer 41 is swung in the region where the supply of ultrasonic waves is optimized by adjusting the ultrasonic bath 61, ultrasonic waves which act on the wafer 41 can be optimized.

The standing waves of ultrasonic waves have loops (high-strength portions) and nodes (low-strength portions) at constant separation. Therefore, ultrasonic waves are difficult to uniform in the wafer processing bath 11.

However, since the wafer processing apparatus 100 swings the wafer 41 with the holder driving mechanism 31, it can uniformly process the wafer 41 regardless of a somewhat nonuniform distribution of the ultrasonic wave strength. Even if the direction to move the wafer 41 is a simple direction such as only the horizontal, vertical, or oblique direction, it can contribute to the processing uniformity of the wafer 41. By swinging the wafer 41 in its axial direction (z-axis direction), the processing nonuniformity between wafers attributed to high-strength portions of ultrasonic waves in the horizontal plane can be corrected.

Since the wafer processing apparatus 100 further comprises the swing support member 13, the swinging amount of the wafer 41 can be efficiently increased. The fixed position of the swing support member 13 is not limited to the bottom portion of the wafer processing bath 11. As far as the swing support member 13 can contact with all wafers 41 of the wafer holder 21, it can be fixed to, e.g., the side wall of the wafer processing bath 11 or the holder driving mechanism 31 (in this case, a mechanism of changing the relative positional relationship between the swing support member 13 and the gripping portions 31a is arranged).

According to the wafer processing apparatus 100, since no driving mechanism exists in the wafer processing bath 11, no particle is produced by the driving mechanism.

Even if the wafer processing apparatus 100 does not comprise any ultrasonic bath 61, it can function as an apparatus suitable for wafer processing. More specifically, if the wafer processing apparatus 100 has a function of swinging the wafer holder 21 within the wafer processing bath 11 by the holder driving mechanism 31, it can uniformly process the wafer 41 with only this function, and effectively agitate the processing solution. A gas or the like produced upon processing the wafer 41 can be efficiently removed from the surface of the wafer 41. Since the holder driving mechanism 31 can serve as both convey and swinging mechanisms for the wafer 41, wafers can be efficiently processed.

Figure 4A:
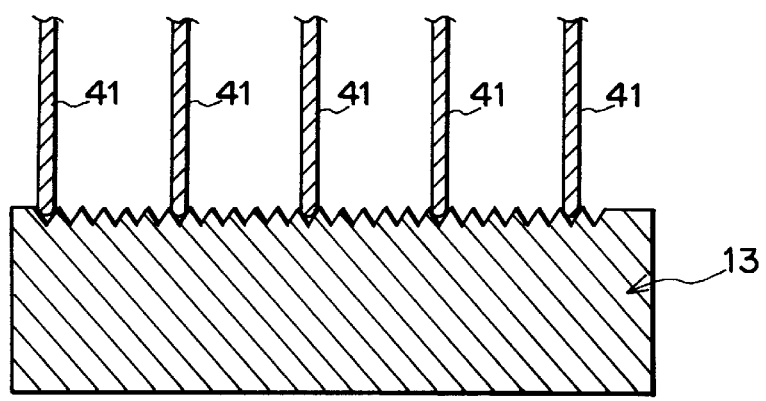
FIGS. 4A and 4B are views each showing another example of the construction of the swing support member.
Figure 4B:
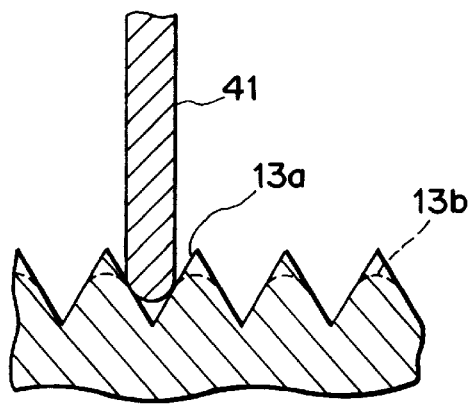

FIG. 4A is an overall view of another example of the construction of the swing support member 13. FIG. 4B is an enlarged view of part of the swing support member 13. If the strength of ultrasonic waves is high, the distal end portion of the swing support member 13 and the wafer 41 may slip and fail to efficiently swing the wafer 41.

A swing support member 13' shown in FIGS. 4A and 4B has V-shaped grooves 13a at constant intervals. By forming these V-shaped grooves 13a, the contact area with the wafers 41 can be increased. Since the swing support member 13' engages with the wafer 41 so as to pinch it, the swing efficiency of the wafer 41 increases. Even if the wafer 41 vibrates to be temporarily spaced apart from the swing support member 13', the frictional force with the wafer 41 does not decrease unless the wafer 41 accurately vertically moves.

The groove at the distal end portion of the swing support member 13' may have a shape 13b, i.e., a full-wave rectifying shape. In this case, since the groove does not have any top, unlike the V-shaped groove 13a, generation of particles upon contact with the wafer 41 can be suppressed.

Second Embodiment

Figure 5A:
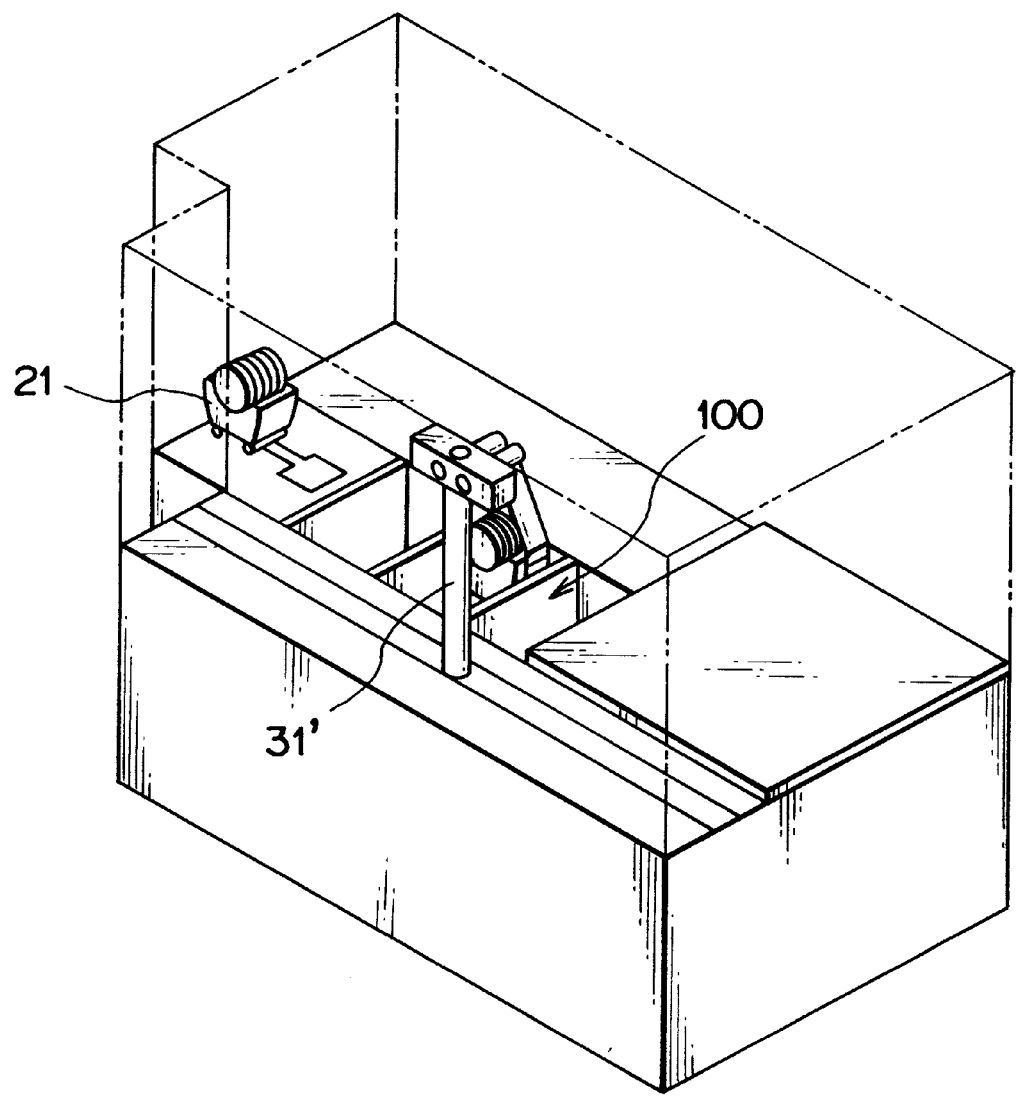
FIG. 5A is a perspective view showing an outline of the construction of a wafer processing system incorporating the wafer processing apparatus.
Figure 5B:
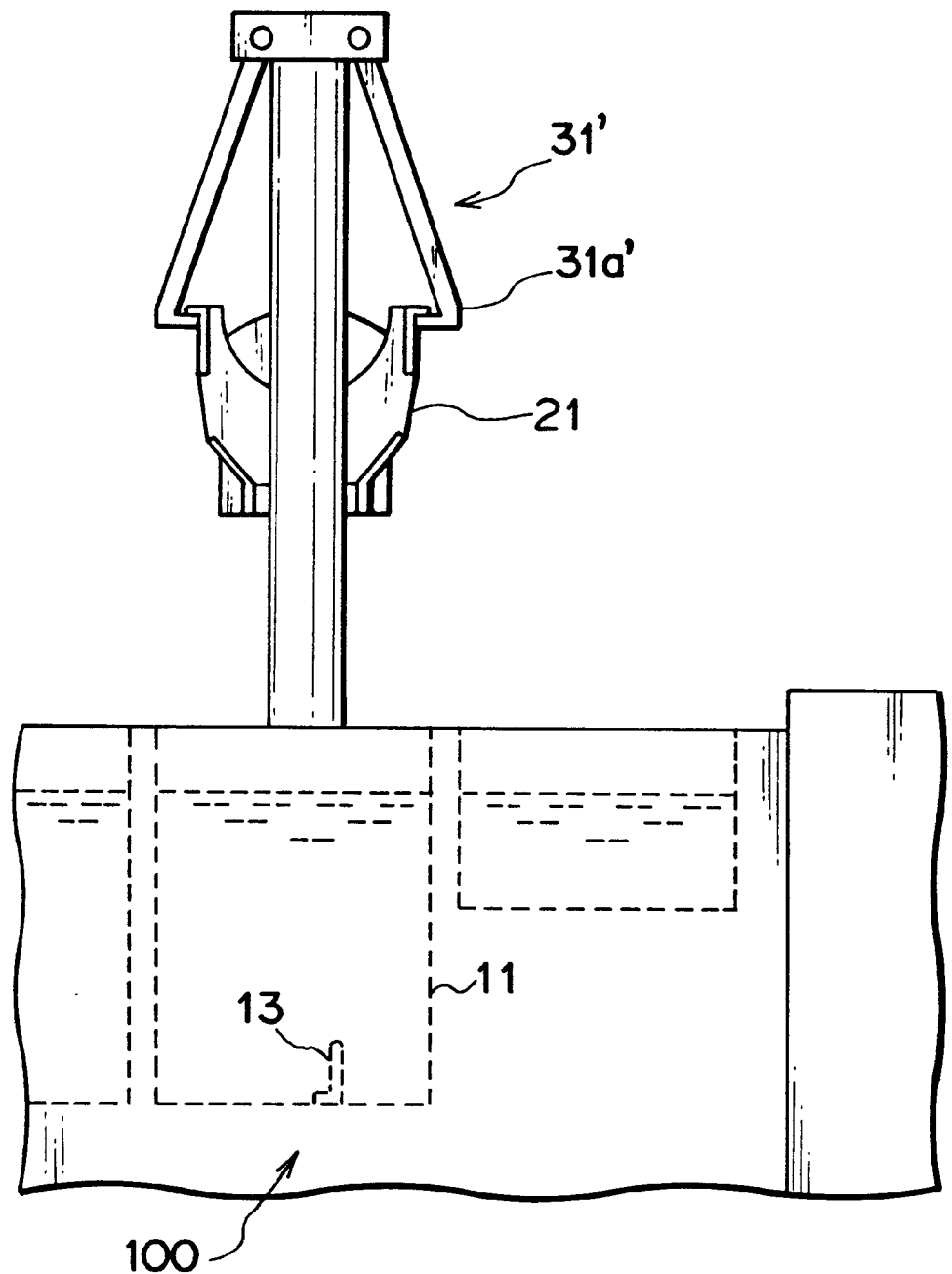
FIG. 5B is a front view showing an outline of the construction of the wafer processing system incorporating the wafer processing apparatus.

FIG. 5A is a perspective view showing an outline of the construction of a wafer processing system incorporating a wafer processing apparatus 100. FIG. 5B is a front view showing part of the wafer processing system shown in FIG. 5A.

This wafer processing system is preferably a combination of a loader, a wafer processing apparatus (e.g., an etching or cleaning apparatus), a spin dryer, an unloader, and the like.

Reference numeral 31' denotes a holder driving mechanism having substantially the same function as that of the holder driving mechanism 31, which has gripping portions 31a' for gripping a wafer holder 21, a means for driving the wafer holder 21 horizontally (alignment direction of the respective apparatuses), and a means for vertically driving the wafer holder 21.

This wafer processing system can automatically process a wafer under computer control. Particles produced by the intervention of the operator can be prevented from attaching to wafers, and the processing efficiency can be increased.

Third Embodiment

Figure 6A:
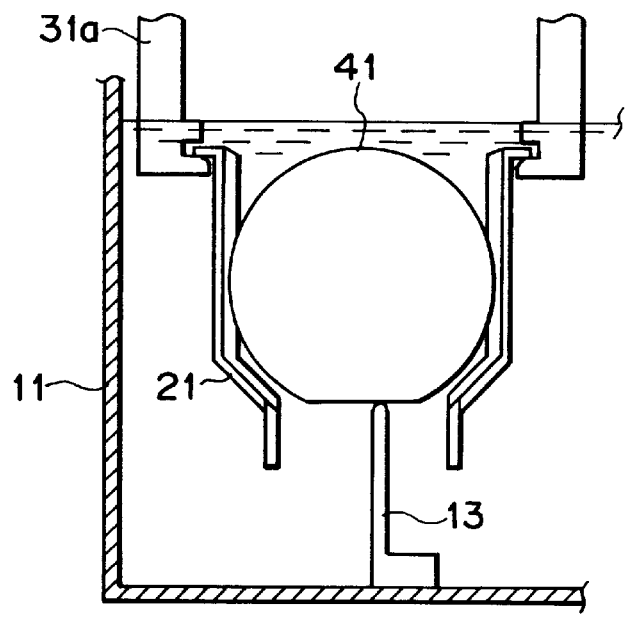
FIGS. 6A to 6D are views for explaining another example of the wafer swinging method.
Figure 6B:
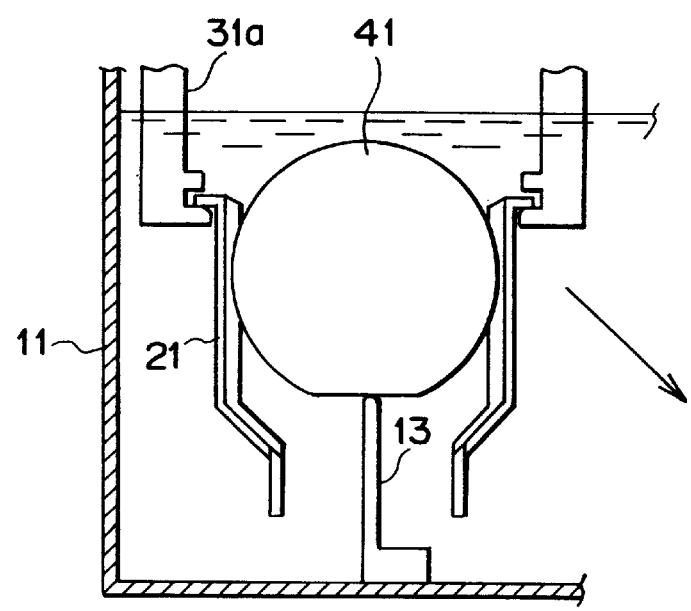

The third embodiment will exemplify another wafer swinging method. FIGS. 6A to 6D are views for explaining a wafer swinging method in this embodiment. In FIGS. 6A to 6D, the arrows indicate the moving direction of a wafer holder 21. FIG. 6A shows a state immediately before starting swinging a wafer. When the start of wafer swinging is instructed, a holder driving mechanism 31 moves gripping portions 31a downwardly to the right under computer control, as shown in FIG. 6B. The moving direction is suitably at an angle of about 45° with respect to the horizontal plane. When the wafer holder 21 has moved downwardly to the right, a wafer 41 rotates clockwise about the distal end portion of a swing support member 13 while its peripheral portion is pressed by the left side wall of the wafer holder 21.

Figure 6C:
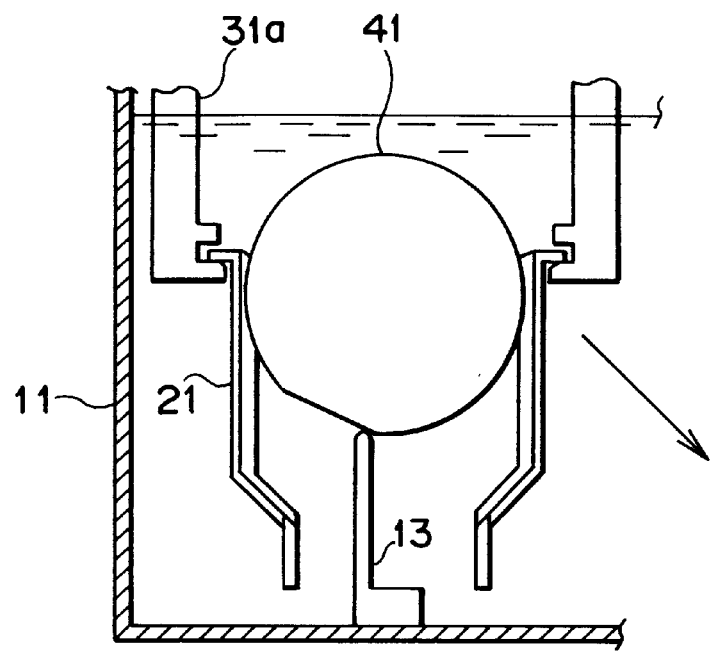

After the wafer holder 21 has moved downwardly to the right, the center of gravity of the wafer 41 moves to the right with respect to the distal end portion of the swing support member 13, and the wafer 41 rotates toward the right side wall of the wafer holder 21 to settle to a state shown in FIG. 6C.

Figure 6D:
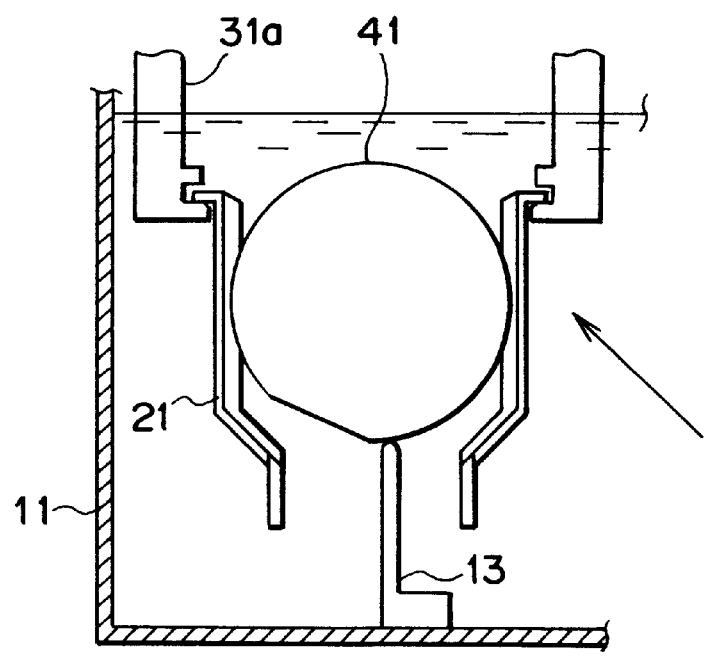

Upon moving the wafer holder 21 downwardly to the right, the holder driving mechanism 31 moves the gripping portions 31a upwardly to the left, as shown in FIG. 6D. The moving direction is preferably opposite to the moving direction shown in FIG. 6B.

When the wafer holder 21 has moved upwardly to the left, the wafer 41 rotates counterclockwise about the swing support member 13 while its peripheral portion is pressed by the right side wall of the wafer holder 21. By moving the wafer holder 21 to a state shown in FIG. 6A, one operation is completed.

By repeatedly performing the above operation (FIG. 6A→FIG. 6B→4 FIG. 6C→4 FIG. 6D), the wafer 41 can be properly swung and uniformly processed.

Fourth Embodiment

Figure 7:
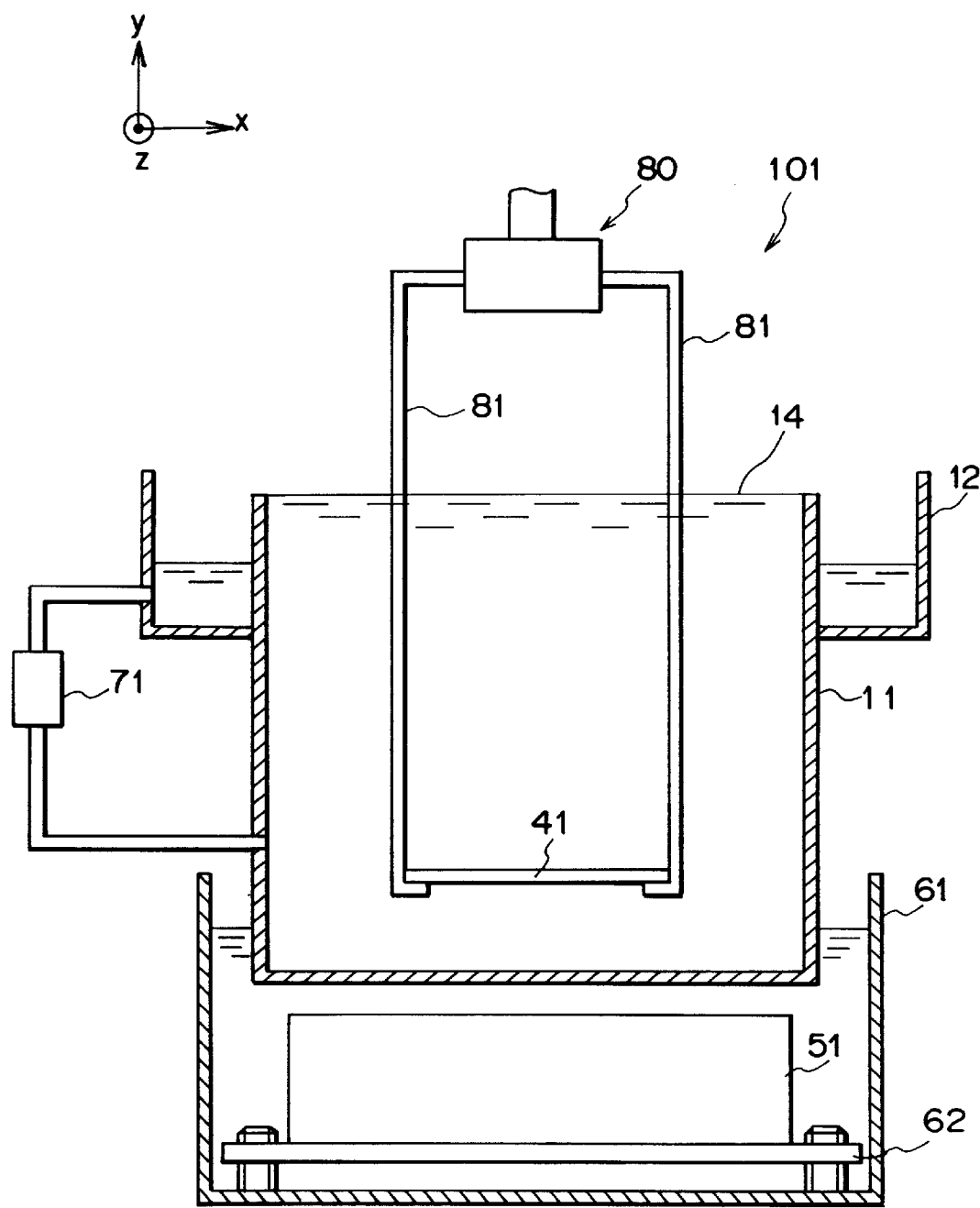
FIG. 7 is a view showing an outline of the construction of a wafer processing apparatus according to another embodiment of the present invention.

The fourth embodiment is directed to a wafer processing apparatus having another construction. FIG. 7 is a view showing an outline of the construction of the wafer processing apparatus according to this embodiment. The same reference numerals as in the construction of the wafer processing apparatus 100 according to the first embodiment denote substantially the same constituent elements, and a description thereof will be omitted.

A wafer processing apparatus 101 according to the fourth embodiment holds a wafer 41 with a wafer moving mechanism 80 almost parallel to the bottom surface of a wafer processing bath 11 (i.e., almost parallel to the plane of vibration of ultrasonic waves), and swings the wafer 41 while completely dipping it into a processing solution (e.g., cleaning or etching solution) within the wafer processing bath 11. In this manner, the wafer 41 is uniformly processed, and contamination of the wafer 41 by particles is prevented.

The wafer moving mechanism 80 grips the wafer 41 with arms 81, and swings the wafer 41 in the wafer processing bath 11. The wafer 41 is preferably swung in a direction perpendicular to the plane of vibration of ultrasonic waves (i.e., vertical direction), or in a direction parallel to the plane of vibration (i.e., horizontal direction).

Also in the wafer processing apparatus 101, the wafer 41 is preferably processed while being completely dipped into the processing solution. In this case, particles can be prevented from attaching to the wafer 41 near the interface between the processing solution and ambient atmosphere.

According to the wafer processing apparatus 101, the wafer 41 can be uniformly processed by swinging it in the wafer processing bath 11.

Application of Wafer Processing Apparatus

The wafer processing apparatus 100 according to the above embodiments is suitable as, e.g., an etching apparatus. According to this etching apparatus, 1) a wafer can be uniformly etched, 2) contamination by particles can be reduced, and 3) the etching rate can be increased.

The wafer processing apparatus 100 is suited as an etching apparatus for etching a wafer having a porous silicon layer. The mechanism of etching of porous silicon is disclosed in K. Sakaguchi et al., Jpn. Appl. Phys. Vol. 34, part 1, No. 2B, 842–847 (1995). Porous silicon is etched when an etching solution penetrates into the pores of porous silicon by a capillary action and etches the walls of the pores. As the walls of the pores become thinner, these walls cannot support themselves beyond some point. Finally, the porous layer entirely collapses to complete the etching. When the pore walls are left to collapse by the action of only the etching solution without any etching assistance, the etching rate of the hole wall is low, and the etching time is long. In a region where the porous layer collapses, the underlayer is etched. For this reason, variations in in-plane etching rate of a porous silicon wafer and etching rate between wafers are preferably suppressed as much as possible.

For example, a first substrate is prepared by forming a porous silicon layer on a single-crystal silicon substrate, growing an epitaxial layer on the porous silicon layer, and forming an insulating film on the epitaxial layer. The first substrate and a second substrate are so adhered as to sandwich the insulating film between them. Then, the single-crystal silicon substrate is removed from the lower surface of the first substrate, and the porous silicon layer is etched to fabricate an SOI wafer. This method requires an etching selectivity (porous silicon/epitaxial layer) of only about $10^5$.

Even if an etching method having high selectivity is employed, however, the surface of the SOI layer exposed upon removing the porous silicon layer by etching is slightly etched. Such slight unwanted etching does not seriously degrade the thickness uniformity of the SOI layer, but higher selectivity and higher thickness uniformity are demanded. In the future, as the wafer size increases, higher thickness uniformity of the SOI layer will be demanded.

When the wafer processing apparatus 100 is applied to a porous silicon etching apparatus, in-plane variations of the SOI layer and variations between wafers can be suppressed by swinging wafers within the wafer processing bath, and higher-quality SOI substrates can be fabricated.

By swinging wafers, and in addition, performing etching while supplying ultrasonic waves, the collapse of the porous silicon layer can be promoted, the etching time can be shortened, and the etching selectivity can be increased.

An example of a method of fabricating a semiconductor substrate using the wafer processing apparatus according to the above embodiments will be described below.

FIGS. 8A to 8F are views, respectively, showing the method of fabricating a semiconductor substrate. Roughly speaking, in this fabrication method, the first substrate is prepared by forming a porous silicon layer on a single-crystal silicon substrate, forming an unporous layer on the porous silicon layer, and preferably forming an insulating film on the unporous layer. The first structure and a second substrate prepared separately are so adhered as to sandwich the insulating film between them. After that, the single crystal silicon substrate is removed from the lower surface of the first substrate, and the porous silicon layer is etched to fabricate a semiconductor substrate.

The method of fabricating a semiconductor substrate will be described in detail below with reference to FIGS. 8A to 8F.

Figure 8A:
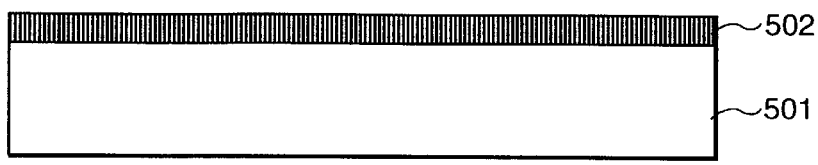
FIGS. 8A to 8F are views, respectively, showing a method of fabricating a semiconductor substrate.
Figure 8B:
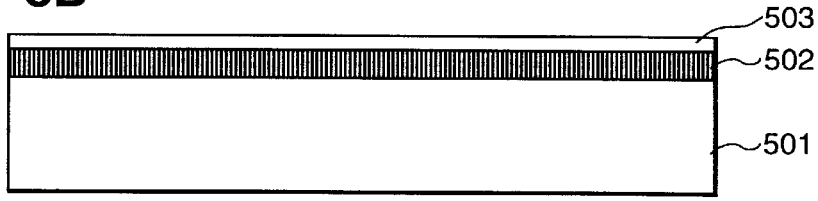

A single-crystal Si substrate 501 for forming the first substrate is prepared, and a porous Si layer 502 is formed on the major surface of the single-crystal Si substrate 501 (see FIG. 8A). At least one unporous layer 503 is formed on the porous Si layer 502 (see FIG. 8B). Preferable examples of the unporous layer 503 are a single-crystal Si layer, a poly-Si layer, an amorphous Si layer, a metal film layer, a compound semiconductor layer, and a superconductor layer. An element such as MOSFET may be formed on the unporous layer 503.

Figure 8C:
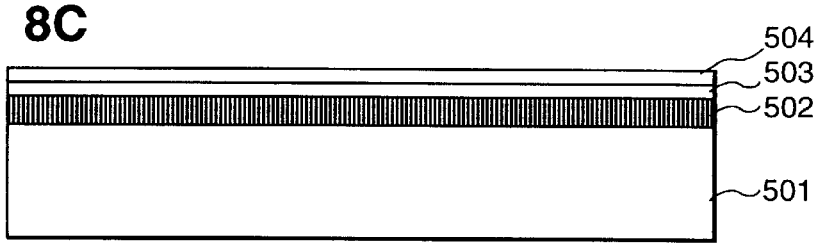

An $SiO_2$ layer 504 is preferably formed as another unporous layer on the unporous layer 503, and used as the first substrate (see FIG. 8C). The SiO$_2$ layer 504 is useful because, when the first substrate and a second substrate 505 are adhered in the subsequent step, the interface energy at the adhered interface can be removed from an active layer.

Figure 8D:
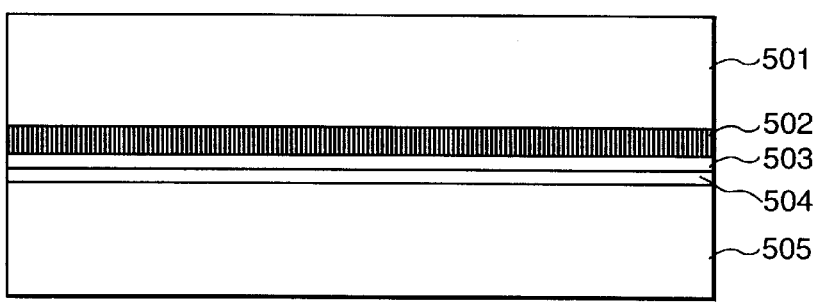

The first substrate and the second substrate 505 are tightly adhered at room temperature so as to sandwich the SiO$_2$ layer 504 between them (see FIG. 8D). This adhesion may be strengthened by performing anode coupling, pressurization, or heat treatment, as needed, or a combination of them.

When a single-crystal Si layer is formed as the unporous layer 503, the first substrate is preferably adhered to the second substrate 505 after the SiO$_2$ layer 504 is formed on the surface of the single-crystal Si layer by thermal oxidation or the like.

Preferable examples of the second substrate 505 are an Si substrate, a substrate having an SiO$_2$ layer formed on an Si substrate, a light-transmitting substrate such as a quartz substrate or the like, and a sapphire substrate. The second substrate 505 suffices to have a flat surface to be adhered, and may be another type of substrate.

FIG. 8D shows the adhered state of the first and second substrates via the SiO$_2$ layer 504. The SiO$_2$ layer 504 need not be formed when the unporous layer 503 or the second substrate is not Si.

In adhesion, a thin insulating plate may be inserted between the first and second substrates.

Figure 8E:
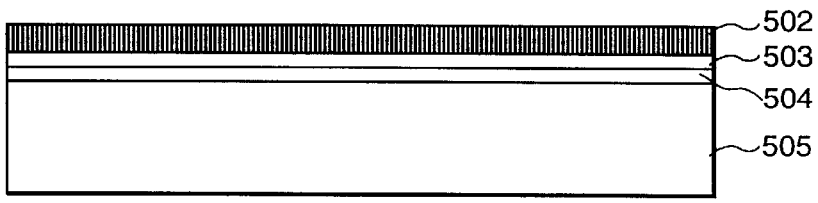

The first substrate is removed from the second substrate at the boundary of the porous Si layer 502 (see FIG. 8E). The removal method includes the first method (of discarding the first substrate) using grinding, polishing, etching, or the like, and. the second method of separating the first and second substrates at the boundary of the porous layer 502. In the second method, the first substrate can be recycled by removing porous Si left on the separated first substrate, and planarizing the surface of the first substrate, as needed.

Figure 8F:
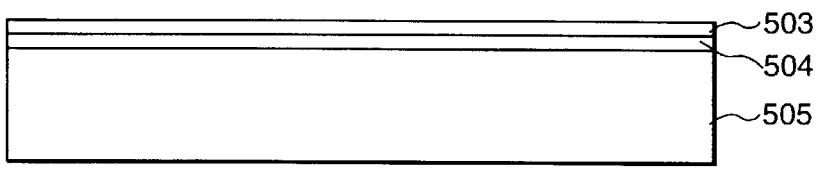

The porous Si layer 502 is selectively etched and removed (see FIG. 8F). The wafer processing apparatus 100 or 101 is suitable for this etching. Since this wafer processing apparatus supplies ultrasonic waves while completely dipping a wafer (in this case, the wafer shown in FIG. 8E) into an etching solution and swinging it, the wafer is hardly contaminated by particles, and the etching is made uniform. According to this wafer processing apparatus, the etching time is shortened, and the etching selectivity between the unporous layer 503 and the porous layer 504 increases. The etching time is shortened because etching is promoted by ultrasonic waves, and the etching selectivity increases because the promotion of etching by ultrasonic waves is more remarkable on the porous layer 504 than on the unporous layer 503.

When the unporous layer 503 is single-crystal Si, the following etching solutions are suited in addition to a general etching solution for Si.

(a) hydrofluoric acid (b) solution mixture prepared by adding at least one of alcohol and hydrogen peroxide to hydrofluoric acid (c) buffered hydrofluoric acid (d) solution mixture prepared by adding at least one of alcohol and hydrogen peroxide to buffered hydrofluoric acid (e) solution mixture of hydrofluoric acid, nitric acid, and acetic acid Using these etching solutions, the porous layer 502 can be selectively etched to leave the underlying unporous layer 503 (single-crystal Si). The porous layer 502 is readily selectively etched by these etching solutions because porous Si has an enormous surface area and hence etching progresses at a very high speed for the unporous Si layer.

FIG. 8E schematically shows a semiconductor substrate obtained by the above fabrication method. According to this fabrication method, the flat unporous layer 503 (e.g., single-crystal Si layer) is uniformly formed on the entire surface of the second substrate 505.

For example, if an insulating substrate is employed as the second substrate 505, the semiconductor substrate obtained by the above fabrication method is effectively used to form insulated electronic elements.

The present invention can make wafer processing uniform, and can prevent contamination of a wafer caused by particles.

The present invention is not limited to the above embodiments and various changes and modifications can be made within the spirit and scope of the present invention. Therefore, to. apprise the public of the scope of the present invention the following claims are made.

What is claimed is:

1. A wafer processing apparatus for processing a wafer by dipping the wafer into a processing solution, comprising:
   a wafer processing bath;
   a holding portion for directly or indirectly holding the wafer; wherein the holding portion allows the wafer to rotate;
   a driving portion for moving said holding portion within said processing bath; and
   a member having a contact portion resting in said processing bath and allowed to contact a peripheral portion of the wafer,
   wherein said driving portion moves said holding portion so as to contact the peripheral portion of the wafer with the resting contact portion of said member for rotating the wafer.

2. The apparatus according to claim 1, wherein said driving portion also serves as a convey mechanism for conveying the wafer between the apparatus and another apparatus.

3. The apparatus according to claim 1, further comprising ultrasonic generating means for generating ultrasonic waves in said processing bath.

4. The apparatus according to claim 1, wherein the contact portion of said member is rounded.

5. The apparatus according to claim 1, wherein the contact portion of said member has a groove in a direction substantially parallel to a wafer surface.

6. The apparatus according to claim 5, wherein the groove has a V shape.

7. The apparatus according to claim 5, wherein the groove has a rectified full-wave shape.

8. The apparatus according to claim 1, wherein said processing bath comprises a circulating mechanism including an overflow bath.

9. The apparatus according to claim 1, wherein said driving portion swings said holding portion to rotate the wafer when the peripheral portion of the wafer comes into contact with the contact portion of said member.

10. The apparatus according to claim 3, wherein said ultrasonic generating means comprises an ultrasonic bath, an ultrasonic source, and an adjusting mechanism for adjusting a position of said ultrasonic source in said ultrasonic bath, and ultrasonic waves are transmitted to said processing bath via an ultrasonic transmitting medium placed in said ultrasonic bath.

11. The apparatus according to claim 1, wherein said driving portion comprises a first driving portion for horizontally driving said holding portion, and a second driving portion for vertically driving said holding portion.

12. The apparatus according to claim 1, wherein said holding portion holds the wafer substantially perpendicular to a bottom surface of said processing bath, and said driving portion swings the wafer within a plane substantially perpendicular to the bottom surface of said processing bath.

13. The apparatus according to claim 1, wherein said driving portion swings said holding portion within said processing bath to substantially uniformly process the wafer with a processing solution.

14. The apparatus according to claim 1, wherein said holding portion can hold a wafer holder capable of storing a plurality of wafers.

15. The apparatus according to claim 1, wherein at least portions of said processing bath, said holding portion, and said driving portion, which may come into contact with a processing solution, are made of a material selected from the group consisting of quartz and plastic.

16. The apparatus according to claim 1, characterized in that at least portions of said processing bath, said holding portion, and said driving portion, which may come into contact with a processing solution, are made of a material selected from the group consisting of a fluorine resin, vinyl chloride, polyethylene, polypropylene, polybutyleneterephthalate (PBT), and polyetheretherketone (PEEK).

17. The apparatus according to claim 1, wherein swing support member are made of a material selected from the group consisting of a fluorine resin, vinyl chloride, polyethylene, polypropylene, polybutyleneterephthalate (PBT), and polyetheretherketone (PEEK).

* * * * *

UNITED STATES PATENT AND TRADEMARK OFFICE
CERTIFICATE OF CORRECTION

PATENT NO. : 6,391,067 B2
DATED : May 21, 2002
INVENTOR(S) : Yanagita et al.

It is certified that error appears in the above-identified patent and that said Letters Patent is hereby corrected as shown below:

<u>Title page,</u>
Item [57], ABSTRACT, should read as follows:

-- A holder driving mechanism holds a wafer holder with gripping portions, and swings it within a wafer processing bath. When the peripheral portion of a wafer comes into contact with the distal end portion of a swing support member, the wafer rotates and vertically moves in the wafer holder. The wafer can be efficiently swung, and processing can be made uniform. By supplying ultrasonic waves from an ultrasonic bath, the processing rate can be increased. --

<u>Column 1,</u>
Line 34, "No. 8-93478" should read -- No. 8-293478 --
Line 52, "wafer –cannot" should read -- wafer cannot --

<u>Column 5,</u>
Line 28, "side on. which" should read -- side on which --

<u>Column 6,</u>
Line 61, "another processing which" should read -- another process, which --

<u>Column 8,</u>
Line 44, "uniformly process-the" should read -- uniformly process the --
Line 61, "member 13. having" should read -- member 13 having --

<u>Column 9,</u>
Line 23, "FIG. 2D → ) FIG. 2E)," should read -- FIG. 2D → FIG. 2E), --

UNITED STATES PATENT AND TRADEMARK OFFICE
CERTIFICATE OF CORRECTION

PATENT NO. : 6,391,067 B2
DATED : May 21, 2002
INVENTOR(S) : Yanagita et al.

It is certified that error appears in the above-identified patent and that said Letters Patent is hereby corrected as shown below:

Column 11,
Line 17, "FIG. 6B → 4 FIG. 6C → 4 FIG. 6D)," should read
-- FIG. 6B → FIG. 6C → FIG. 6D), --

Signed and Sealed this

Third Day of December, 2002

JAMES E. ROGAN
*Director of the United States Patent and Trademark Office*